(12) United States Patent
Tadokoro et al.

(10) Patent No.: US 8,684,151 B2
(45) Date of Patent: Apr. 1, 2014

(54) RAW MATERIAL LOADING APPARATUS AND PIPE UNIT FOR RAW MATERIAL LOADING APPARATUS

(75) Inventors: Masahiro Tadokoro, Minato-ku (JP); Takaya Nakamura, Minato-ku (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 13/420,297

(22) Filed: Mar. 14, 2012

(65) Prior Publication Data
US 2012/0228081 A1 Sep. 13, 2012

Related U.S. Application Data

(63) Continuation of application No. PCT/JP2011/074151, filed on Oct. 20, 2011.

(30) Foreign Application Priority Data

Mar. 9, 2011 (JP) ................................. 2011-051806
Mar. 9, 2011 (JP) ................................. 2011-051807

(51) Int. Cl.
*B65G 11/14* (2006.01)
(52) U.S. Cl.
USPC .................................. 193/30; 193/3; 193/15
(58) Field of Classification Search
USPC .......... 198/2 R, 3, 15, 16, 28, 30; 193/2 R, 3, 193/15, 16, 28, 30
See application file for complete search history.

(56) References Cited

U.S. PATENT DOCUMENTS

| | | | | |
|---|---|---|---|---|
| 1,918,029 A | * | 7/1933 | Goetz | 414/163 |
| 2,726,682 A | * | 12/1955 | Conroy et al. | 285/236 |
| 3,628,676 A | * | 12/1971 | Tucker | 414/199 |
| 3,924,666 A | * | 12/1975 | Raison | 141/231 |

(Continued)

FOREIGN PATENT DOCUMENTS

| JP | 58-55539 | 4/1983 |
|---|---|---|
| JP | 59-115736 | 7/1984 |

(Continued)

OTHER PUBLICATIONS

U.S. Appl. No. 13/430,287, filed Mar. 26, 2012, Nakamura, et al.

(Continued)

*Primary Examiner* — Gene Crawford
*Assistant Examiner* — Keith R Campbell
(74) *Attorney, Agent, or Firm* — Oblon, Spivak, McClelland, Maier & Neustadt, L.L.P.

(57) ABSTRACT

A loading apparatus for loading raw material into a processing apparatus includes an accommodation section accommodating the raw material, upstream and downstream paths through which the raw material is fed in an airtight state into the processing apparatus, a feeding mechanism that feeds in an airtight state the raw material from the accommodation section to the upstream path, a joint section that separates and joins the upstream and downstream paths, and a closing section, positioned in the second path, that can be opened and closed to maintain the processing apparatus and a portion of the downstream path located downstream of the closing section in an airtight state when the joint section separates the upstream and downstream paths. The downstream path is extendable and contractible to move its downstream end with respect to the joint section while the upstream and downstream paths remain joined.

11 Claims, 3 Drawing Sheets

(56) References Cited

U.S. PATENT DOCUMENTS

| | | | |
|---|---|---|---|
| 4,176,994 A * | 12/1979 | Sangster | 414/163 |
| 4,211,316 A * | 7/1980 | Rymarchyk et al. | 193/2 R |
| 5,154,271 A * | 10/1992 | Binzen | 193/30 |
| 5,384,015 A * | 1/1995 | Schroter et al. | 202/251 |
| 5,882,484 A * | 3/1999 | Pyy | 202/262 |
| 6,152,668 A * | 11/2000 | Knoch | 414/164 |
| 7,690,494 B2 * | 4/2010 | Rillmann | 193/30 |
| 8,387,770 B2 * | 3/2013 | Knoch | 193/30 |

FOREIGN PATENT DOCUMENTS

| | | | |
|---|---|---|---|
| JP | 59115736 A * | 7/1984 | B01J 4/00 |
| JP | 62-11169 | 1/1987 | |
| JP | 62-181894 | 11/1987 | |
| JP | 63-194296 | 12/1988 | |
| JP | 7-12897 | 3/1995 | |
| JP | 7-133987 | 5/1995 | |
| JP | 2003-021470 | 1/2003 | |
| JP | 2010-22920 | 2/2010 | |

OTHER PUBLICATIONS

International Search Report issued on Jan. 17, 2012 for PCT/JP2011/074151 filed on Oct. 20, 2011 with English Translation.

International Search Report issued on Nov. 8, 2011 for PCT/JP2011/067774 filed on Aug. 3, 2011 with English Translation.

* cited by examiner

RAW MATERIAL LOADING APPARATUS AND PIPE UNIT FOR RAW MATERIAL LOADING APPARATUS

CROSS-REFERENCE TO RELATED APPLICATION

This application is a continuation application of International Application No. PCT/JP2011/074151, filed Oct. 20, 2011, the entire contents of which are incorporated herein by reference. PCT/JP2011/074151 claims priority to JP 2011-051806, filed Mar. 9, 2011 and JP 2011-051807, filed Mar. 9, 2011.

TECHNICAL FIELD

This invention relates to a processing object loading apparatus for loading a processing object in an airtight state from the outside into the inside of a processing apparatus which processes a processing object in an airtight state, and a pipe unit for use with a processing object loading apparatus and a pipe for use with this pipe unit.

BACKGROUND ART

A processing apparatus which processes a processing object in an airtight state is known. For example, an apparatus is known which carries out a process for loading and melting a silicon material which is a processing object into and in a processing apparatus and solidifying the melted silicon material to fabricate single crystal silicon which is a material for a semiconductor substrate. In the fabrication process of single crystal silicon, the inside of the processing apparatus is placed in a special atmosphere different from that in the open air. For example, the inside of the processing apparatus is placed in an inactive gas atmosphere or a vacuum atmosphere.

And, also a processing object loading apparatus for loading a processing object from the outside into the inside of the processing apparatus in an airtight state is known (for example, Patent Documents 1 and 2).

The processing object loading apparatus (silicon granulation supplying apparatus) disclosed in Patent Document 1 includes a hopper, a feeder, a housing, a quartz port and a bellows. The hopper is provided for accommodating silicon granulation into the inside of the housing having an inactive gas atmosphere, and the feeder for feeding a processing object (silicon granulation) is provided below the hopper. The quartz port is connected to the housing through the bellows. The quartz port is partly inserted in the inside of a processing apparatus (heating furnace) and communicated with the inside of the heating furnace. The insides of the silicon granulation supplying apparatus and the heating furnace are placed in an airtight state. In particular, the inside is placed in an inactive gas atmosphere. More particularly, the insides of the silicon granulation supplying apparatus and the heating furnace are placed in the same inactive gas atmosphere. Consequently, silicon granulation can be loaded from the hopper into the inside of the heating furnace through the quartz port in an airtight state (inactive gas atmosphere).

Also a processing object loading apparatus (mold charge supplying apparatus) disclosed in Patent Document 2 has a basic configuration similar to that of the apparatus disclosed in Patent Document 1. The processing object loading apparatus (mold charge supplying apparatus) includes a hopper, a trough, a vibration section, a mold charge loading chamber and a shooter. The mold charge loading chamber is placed in a vacuum atmosphere and the hopper for accommodating a processing object (mold charge) is provided in the inside of the mold charge loading chamber. The trough for feeding a mold charge and the vibration section are provided below the hopper. The shooter is partly inserted in the inside of a processing apparatus (vacuum chamber) and is communicated with the inside of the vacuum chamber. The mold charge loading chamber and the vacuum chamber are configured so as to be sealed from the outside air, and the insides of the chambers are placed in an airtight state. In particular, the insides of the chambers are placed in a vacuum atmosphere. More particularly, the insides of the mold charge supplying apparatus and the vacuum chamber are placed in the same vacuum atmosphere. Consequently, a mold charge can be loaded from the hopper to the inside of the vacuum chamber through the shooter in an airtight state (vacuum atmosphere).

Incidentally, in the processing object loading apparatus (silicon granulation supplying apparatus) disclosed in Patent Document 1, if silicon granulation must be supplemented into the hopper because of consumption of silicon granulation accommodated in the hopper, then a lid provided on the housing is opened and silicon granulation is supplemented into the hopper. Further, in the processing object loading apparatus (mold charge supplying apparatus) disclosed in Patent Document 2, when it becomes necessary to supplement a mold charge into the hopper because of consumption of a mold charge accommodated in the hopper, a vacuum door provided for the mold charge loading chamber is opened and a mold charge is supplemented into the hopper through the opening.

However, both of the processing object loading apparatus (silicon granulation supplying apparatus and mold charge supplying apparatus) are communicated with the inside of a processing apparatus. Therefore, if it is tried to supplement a processing object during processing by the processing apparatus, then the inside of the processing apparatus is opened to the outside air in accordance with opening of the processing object loading apparatus (opening of a lid or a vacuum door). As a result, an airtight state (special atmosphere) maintained till then is broken. Consequently, supplementation of the processing object cannot be carried out during processing and need be carried out after the processing. Therefore, there is a problem that idle time (operation stopping time) increases.

PRIOR ART DOCUMENTS

Patent Documents

Patent Document 1: Japanese Patent Laid-Open No. Sho 59-115736
Patent Document 2: Japanese Patent Laid-Open No. 2003-21470

SUMMARY OF INVENTION

Technical Problem

Therefore, it is an object of the present invention to provide a processing object loading apparatus of high workability wherein an exit end of a processing object path can be moved readily while a state in which processing object articles can be loaded from a processing object accommodation section, and a pipe unit for the processing object loading apparatus and a pipe for use with this pipe unit.

Technical Solution

According to the present invention, there is provided a processing object loading apparatus for loading a processing object in an airtight state from the outside into the inside of a processing apparatus for processing a processing object in an airtight state by a processing section provided in the inside thereof, including a processing object accommodation section capable of temporarily accommodating a processing object and having an accommodation port capable of being opened and closed and used to accommodate a processing object therethrough, a processing object path along which a processing object to be loaded into the inside of the processing apparatus passes in an airtight state and from an exit end of which the processing object can be loaded, a processing object extraction mechanism capable of extracting the processing object in an airtight state from the processing object accommodation section to the processing object path, a closing section capable of blocking the processing object path between the processing apparatus side and the processing object accommodation section side, and a joint section capable of separating and joining the processing object path at a position of the processing object path on the processing object accommodation section side with respect to the closing section, the exit end of the processing object path being capable of being extended and contracted so as to approach and recede from the joining position while the joining position of the joint section is maintained.

According to the configuration described above, the processing object path can be extended and contracted such that the exit end thereof approaches and recedes from the joining position while the joining position of the joint section is kept maintained. Therefore, the exit end of the processing object path can approach and recede from the processing section without moving the processing object accommodation section in which a processing object is accommodated.

Further, the processing object loading apparatus of the present invention can adopt a configuration that the processing object path has a telescopic pipe unit formed from a combination of a first pipe and a second pipe disposed on the same axial line, the first pipe being disposed on the upstream side in a passing direction of the processing object, the second pipe being disposed on the downstream side in the passing direction such that a downstream end of the second pipe serves as the exit end of the processing object path, the second pipe being moved in a longitudinal direction such that the downstream end of the second pipe moves toward and away from the upstream end of the first pipe to extend and contract the telescopic pipe unit.

According to the configuration described above, the telescopic pipe unit formed from the combination of the first pipe and the second pipe extends and contracts. Therefore, the exit end of the processing object path can be moved to approach and recede from the processing section using a comparatively simple configuration.

Further, the processing object loading apparatus of the present invention can adopt a configuration that the telescopic pipe unit is configured such that, when the downstream end of the second pipe approaches the upstream end of the first pipe, the downstream end of the first pipe is inserted into the second pipe, the closing section being disposed between the downstream end of the first pipe and the upstream end of the second pipe, loading of a processing object being carried out in a state in which the closing section is open and the downstream end of the first pipe is inserted in the second pipe.

According to the configuration described above, in a state in which the closing section is open and the downstream end of the first pipe is inserted in the second pipe, loading of a processing object is carried out. Therefore, it is possible to prevent a component part of the closing section which implements the blocking from being contacted by the processing object, and occurrence of incomplete blocking by a fragment of a processing object caught by the component part can be suppressed.

Further, the processing object loading apparatus of the present invention can adopt a configuration that a portion of the telescopic pipe unit which can contact with the outside air between the processing apparatus and the joint section has air-tightness and besides is covered with a facing which is capable of being extended and contracted in a longitudinal direction.

According to the configuration described above, since the telescopic pipe unit is covered with the facing, it is not directly exposed to the outside air, and occurrence of damage to the telescopic pipe unit can be suppressed. It is to be noted that the "outside air" signifies an external atmosphere of the processing object loading apparatus and the processing apparatus.

Meanwhile, according to the present invention, there is provided a pipe unit for use with a processing object loading apparatus for loading a processing object in an airtight state from the outside into the inside of a processing apparatus for processing a processing object in an airtight state by a processing section provided in the inside thereof, the processing object loading apparatus including a processing object accommodation section capable of temporarily accommodating a processing object and having an accommodation port capable of being opened and closed and used to accommodate a processing object therethrough, a processing object path along which a processing object to be loaded into the inside of the processing apparatus passes in an airtight state and from an exit end of which the processing object can be loaded, a processing object extraction mechanism capable of extracting the processing object in an airtight state from the processing object accommodation section to the processing object path, a closing section capable of blocking the processing object path between the processing apparatus side and the processing object accommodation section side, and a joint section capable of separating and joining the processing object path at a position of the processing object path on the processing object accommodation section side with respect to the closing section, the pipe unit configuring part of the processing object path and having an pipe entrance end serving as an entrance for a processing object and a pipe exist end serving as an exit end of the processing object path, the pipe unit being capable of being extended and contracted while the position of the pipe entrance end is fixed.

According to the configuration described above, the pipe unit for a processing object loading apparatus can be extended and contracted while the position of the input end of the pipe is kept fixed. Therefore, it is possible to move the exit end of the processing object path to approach and recede from the processing section without moving the processing object accommodation section of the processing object loading apparatus.

Further, the pipe unit for use with a processing object loading apparatus of the present invention can adopt a configuration that the pipe unit is formed from a combination of a first pipe and a second pipe disposed on the same axial line, the first pipe being disposed on the upstream side in a passing direction of the processing object, the second pipe being disposed on the downstream side in the passing direction such that a downstream end of the second pipe serves as the exit end of the processing object path, the second pipe being moved in a longitudinal direction such that the downstream end of the second pipe moves toward and away from the upstream end of the first pipe to extend and contract the telescopic pipe unit.

According to the configuration described above, the pipe unit formed from the combination of the first pipe and the second pipe extends and contracts. Therefore, the exit end of the processing object path can be moved to approach and recede from the processing section using a comparatively simple configuration.

Further, the pipe unit for use with a processing object loading apparatus of the present invention can adopt a configuration that the telescopic pipe unit is configured such that, when the downstream end of the second pipe approaches the upstream end of the first pipe, the downstream end of the first pipe is inserted into the second pipe, the closing section of the processing object loading apparatus being disposed between the first pipe and the second pipe, a processing object passing the pipe unit in a state in which the closing section is open and the downstream end of the first pipe is inserted in the second pipe.

According to the configuration described above, in a state in which the closing section is open and the downstream end of the first pipe is inserted in the second pipe, loading of a processing object is carried out. Therefore, it is possible to prevent a component part of the closing section which implements the blocking from being contacted by the processing object, and occurrence of incomplete blocking by a fragment of a processing object caught by the component part can be suppressed.

Further, the pipe unit for use with a processing object loading apparatus of the present invention can adopt a configuration that a portion of the pipe unit which can contact with the outside air between the processing apparatus and the joint section in a state in which the pipe unit is attached to the processing object loading apparatus has air-tightness and besides is covered with a facing which is capable of being extended and contracted in a longitudinal direction.

According to the configuration described above, since the pipe unit is covered with the facing, it is not directly exposed to the outside air, and occurrence of damage to the pipe unit can be suppressed. It is to be noted that the "outside air" signifies an external atmosphere of the processing object loading apparatus and the processing apparatus.

And, according to the present invention, there is provided a pipe for use with any of the pipe units described above.

Advantageous Effect

According to the invention, since the exit end can be moved to approach and recede from the processing section without moving the processing object accommodation section which accommodates a processing object, it is easy to move the processing object path while it is in a state in which a processing object article can be loaded from the processing object accommodation section. Therefore, the operability is good.

MODE FOR CARRYING OUT THE INVENTION

The present invention is described below in connection with an embodiment thereof with reference to the drawings. In regard to terms used to represent directions in the following description, "upward and downward" directions are represented with reference to upward and downward directions in FIG. 1. Meanwhile, in regard to "forward and backward" directions, the side near to a processing apparatus F1 is represented as a forward direction and the side remote from the processing apparatus F1 is represented as a backward direction. Further, "upstream and downstream" are given with reference to the passing direction (flowing direction) of a processing object S. However, it shall not be understood that the present invention is restricted to the mode described in connection with the above-described directions.

Here, a technique on which the present invention is based is described for reference.

Figure 3:
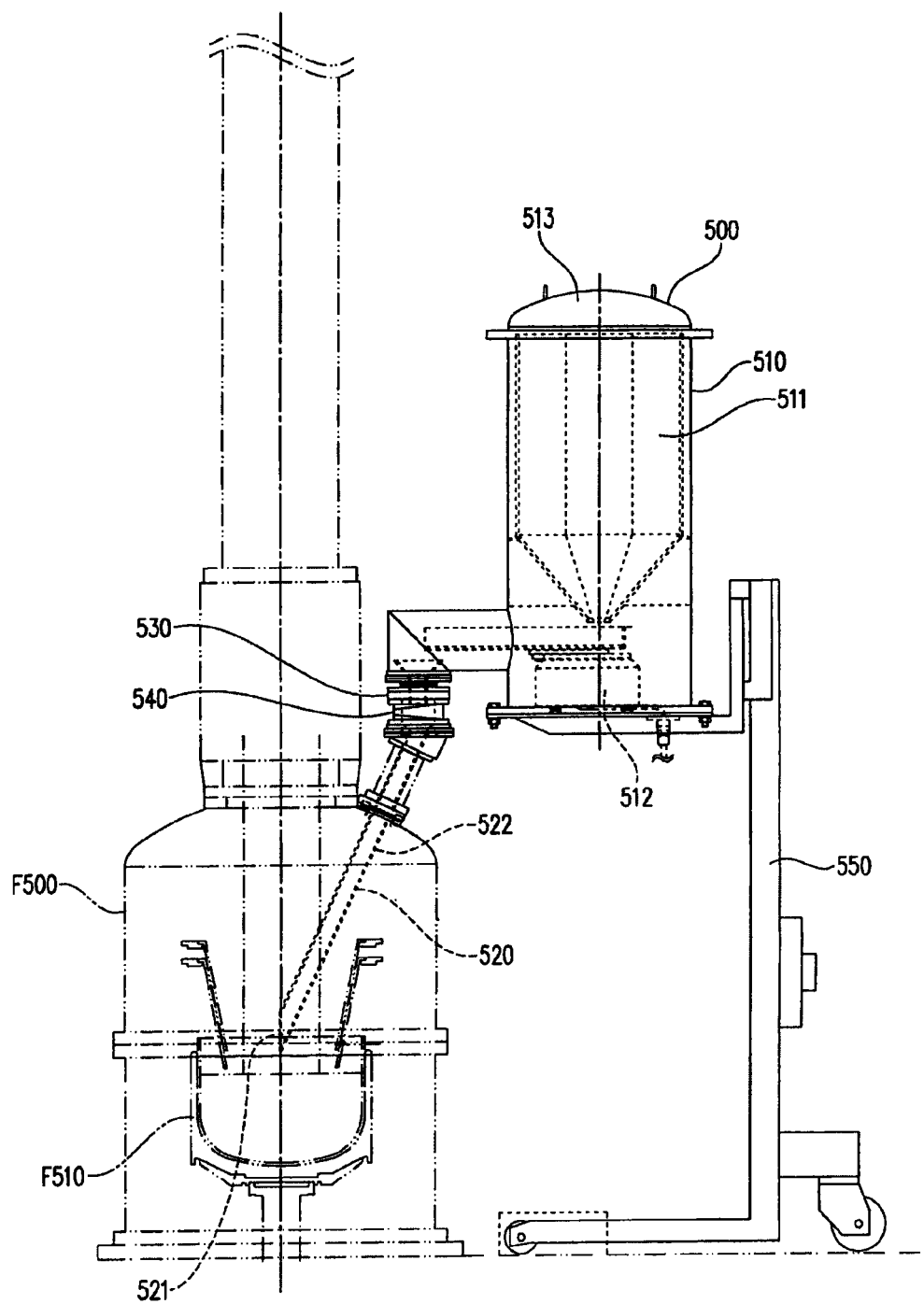
FIG. 3 is a schematic view showing a processing apparatus and a processing object loading apparatus invented by the inventors of the present application previously.

To solve the above-described problem that the idle time (actual work stopping time) increases, the inventors of the present application invented such a processing object loading apparatus 500 as shown in FIG. 3 (Japanese Patent Application No. 2010-178954). This processing object loading apparatus 500 can load processing object articles from the outside of a processing apparatus F500, which includes an internally provided furnace body (pot) F510 for heating processing object articles (particularly polycrystalline silicon (silicon nuggets)) to melt, into the furnace body F510.

In particular, the processing object loading apparatus 500 includes a processing object accommodation section (hopper) 511 which can temporarily accommodate processing objects therein, and a feeder 512 for feeding processing object articles supplied thereto from the processing object accommodation section 511. Further, the processing object loading apparatus 500 includes a loading apparatus main body 510 supported at a portion thereof including the processing object accommodation section 511 and the feeder 512 for composite upward or downward, forward or backward and leftward or rightward movement by a moving mechanism 550, and a processing object path 520 along which processing object articles to move from the loading apparatus main body 510 to the processing apparatus F500 can pass. The processing object path 520 has a pipe-formed section 522 made of quartz glass and integrated with the same in a longitudinal direction. The pipe-formed section 522 is provided such that it is directed in an obliquely downward direction as seen in FIG. 3. A processing object can be loaded into the furnace body F510 from an exit end 521 of the pipe-formed section 522. The processing object path 520 includes a driving mechanism and can move (advance and retreat) in the longitudinal direction with respect to the furnace body F510. The retreating movement of the processing object path 520 is carried out so as not to interfere with single crystal silicon in a solidified state when the single crystal silicon is to be drawn up.

Further, between the loading apparatus main body 510 and the processing object path 520, a joint section 530 is provided such that the loading apparatus main body 510 and the processing object path 520 can be separated. Further, a closing section 540 which can close the processing object path 520 is provided on the downstream side (in the passing direction of the processing object) of the joint section 530. Therefore, if a lid section 513 provided on the loading apparatus main body 510 is opened while the closing section 540 is in a closed state, then processing object articles can be supplemented into the processing object accommodation section 511. The supplementing work of the processing object can be carried out in a higher efficiency by separating the loading apparatus main body 510 from the processing object path 520 at the joint section 530 and then moving the processing object accommodation section 511 to a place at which the processing object accommodation section 511 can be worked easily by means of the moving mechanism 550.

As described above, with the processing object loading apparatus 500 invented by the inventors of the present application, supplementing of a processing object can be carried out without destroying the specific atmosphere in the inside of the processing apparatus F500.

Incidentally, by the momentum upon dropping of processing object articles loaded into the furnace body F510, unmelted processing object articles in the furnace body F510 or processing object articles in a melted state (molten material) sometimes jump up and go out of the furnace body F510. In order to prevent this, it is desirable to dispose the exit end 521 of the processing object path 520 at a position as near as possible to the surface of the molten material or unmelted processing object articles in the furnace body F510 in any of a case of loading before processing and a case of supplemental loading during processing of the processing object.

If processing object articles are loaded in a state in which the exit end 521 of the processing object path 520 is disposed at a position as near as possible to the surface of molten substance in this manner, then such processing object articles sometimes pile up like a mountain in the furnace body F510. In this instance, the processing object articles close up the exit end 521 of the processing object path 520 to clog the processing object path 520 thereby to disable continuing of the loading of processing object articles. Further, as the melting of the processing object proceeds, the surface of the molten material in the furnace body F510 rises, and the exit end 521 of the processing object path 520 is sometimes soaked in the molten material. In such cases as described above, if the processing object path 520 can be retracted (moved in a rightwardly upward direction in FIG. 3) from the processing apparatus F500, then a gap is produced between the processing object articles in an unmelted state which pile up like a mountain as described above and the exit end 521 of the processing object path 520, and it becomes possible to load such clogging processing objects as described above into the furnace body F510. Further, the exit end 521 of the processing object path 520 can be spaced away from the rising surface of the molten material.

However, the processing object path 520 has the pipe-formed section 522 formed integrally in the longitudinal direction as described hereinabove. Therefore, if it is tried to retract the processing object path 520 as described, then the entire processing object path 520 is retracted. In other words, together with the exit end 521 of the processing object path 520, also the joint section 530 at the upper end in FIG. 3 of the processing object path 520 moves obliquely upwardly.

Therefore, in order not to stop loading of a processing object from the loading apparatus main body 510 into the furnace body F510, it is necessary to retract the loading apparatus main body 510 from the processing object path 520 while the loading apparatus main body 510 remains not separated from the processing object path 520 as shown in FIG. 3. Therefore, it is necessary to move also the loading apparatus main body 510 in the same direction.

However, the retraction of the processing object path 520 which is carried out in order to avoid interference with the single crystal silicon when the single crystal silicon is to be drawn up is premised on an assumption that it is carried out in a state in which the loading apparatus main body 510 is separated at the joint section 530 from the processing object path 520. Then, it is not assumed that the processing object path 520 is retracted while the loading apparatus main body 510 is not separated from the processing object path 520. Therefore, the loading apparatus main body 510 does not have a configuration by which it is moved in response to the retraction of the processing object path 520.

In short, the moving mechanism 550 can be moved only separately in a different one of the upward and downward, forward and downward, and leftward and rightward directions. Therefore, in order to retract the processing object path 520 while the loading apparatus main body 510 remains not separated from the processing object path 520, the loading apparatus main body 510 must, for example, be moved in the upward direction and then moved in the rearward direction in accordance with the movement of the joint section 530 in the obliquely upward direction. Then, since the loading apparatus main body 510 must be moved separately in the upward direction first and then in the rearward direction, the distance of the movement in one cycle cannot be made great. Therefore, it cannot be avoided to carry out retraction of the processing object path 520 and movement of the loading apparatus main body 510 alternately and bit by bit. Besides, the loading apparatus main body 510 in which processing objects are accommodated is heavy and becomes approximately 200 kg. Consequently, it is very difficult to move the exit end 521 of the processing object path 520 without separating the loading apparatus main body 510 from the processing object path 520. In this manner, the processing object loading apparatus 500 has room for improvement regarding the workability. The present invention assumes the problem described above.

—Processing Apparatus—

Figure 1:
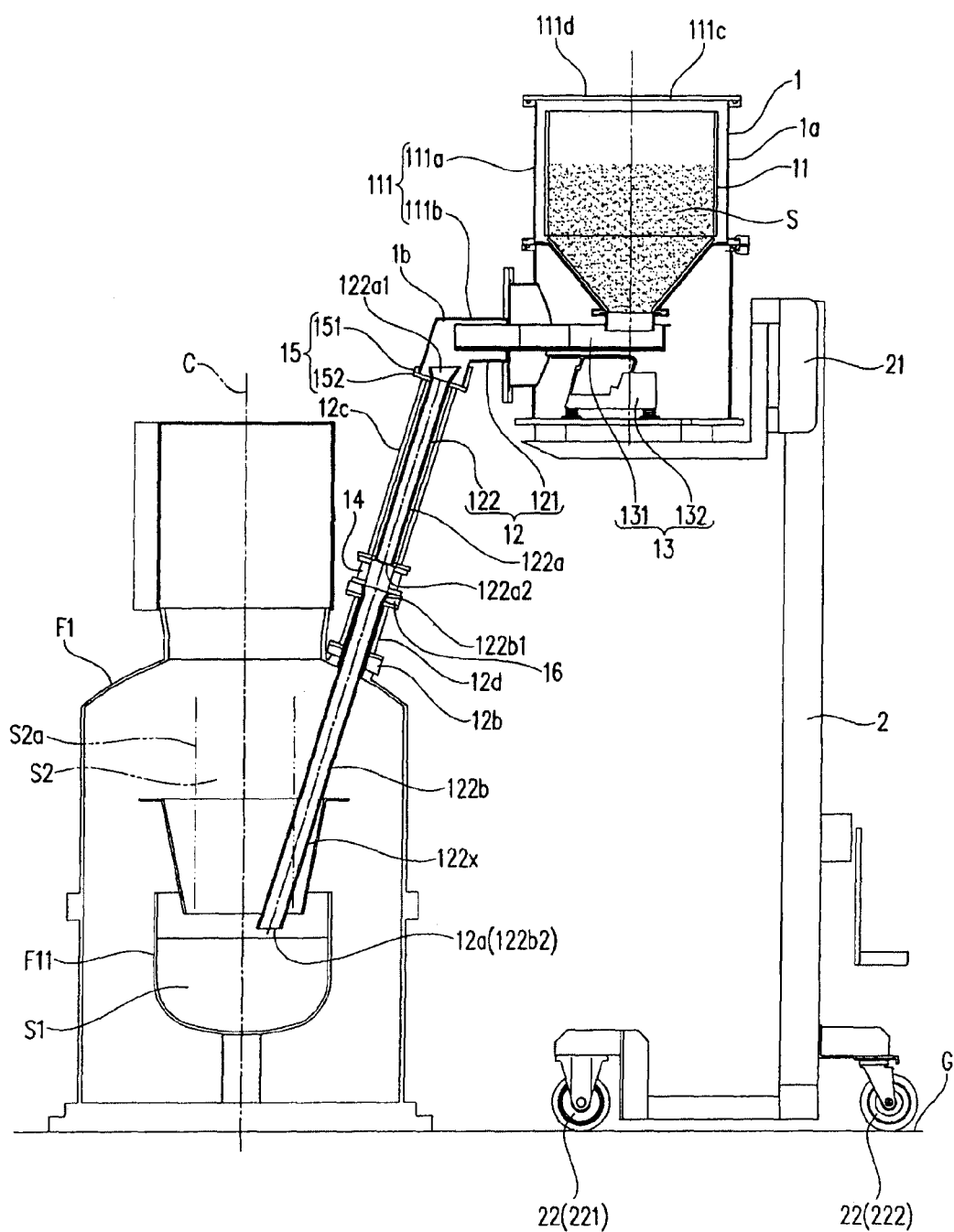
FIG. 1 is a schematic view showing a processing apparatus and a processing object loading apparatus.

First, the processing apparatus F1 which is an object to which a processing object loading apparatus 1 according to the present embodiment is to be attached is described. As shown in FIG. 1, in the processing apparatus F1, the inside thereof can be placed in an airtight state and a processing object S can be melted by means of an furnace body (pot) F11, as a processing section, provided in the inside of the processing apparatus F1. In the present embodiment, the processing apparatus F1 is used for fabricating single crystal silicon S2 which is a material for a semiconductor substrate. In the furnace body F11, polycrystalline silicon in the form of nuggets (silicon nuggets) is loaded as the processing object S and is melted by heating. Incidentally, the diametrical dimension of the silicon nuggets used in the present embodiment is approximately 10 mm.

In the processing apparatus F1 of the present embodiment, the single crystal silicon S2 is fabricated by the CZ method. The fabrication method for the single crystal silicon S2 in the present embodiment is described briefly. First, in an inactive gas atmosphere, the silicon nuggets loaded in the furnace body F11 are heated to approximately 1,800° C. so as to be melted. Single crystal silicon used as a seed is soaked into the silicon (hereinafter referred to as "molten material") S1 placed in a melted state, and thereafter, the single crystal silicon used as a seed is drawn up slowly while it is rotated so that crystal is grown. Then, the single crystal silicon (ingot) S2 which is a substantially cylinder-shaped solid body is formed finally. In other words, the processing apparatus F1 is used to draw up the single crystal silicon S2 from the molten material S1.

In particular, the inactive gas atmosphere in the present embodiment signifies an atmosphere configured by placing the internal space of the processing apparatus F1 into a vacuum state once and thereafter filling the internal space with inactive gas such as argon, nitrogen or the like. Therefore, a deairing pump (vacuum pump) and an inactive gas supplying pipe (not shown) are provided in the processing apparatus F1. It is to be noted that, if a closing section 14 hereinafter described is not closed, then also the inside of the processing object loading apparatus 1 hereinafter described is placed in the inactive gas atmosphere same as that in the processing apparatus F1.

Here, the inside of the processing apparatus F1 may be placed in a vacuum atmosphere depending upon a kind of the processing object S. Particularly, where it is desired to remove impurity from the molten material S1, there is the possibility that the inside of the processing apparatus F1 may be placed in a vacuum atmosphere. However, where the inside of the processing apparatus F1 is placed in a vacuum atmosphere in this manner, part of the processing object S is evaporated in the inside of the processing apparatus F1. Since the evaporation just described is inconvenient in the present embodiment, the inactive gas is introduced into the inside of the processing apparatus F1 in order to suppress evaporation of the silicon by pressure of the inactive gas. It is to be noted that the pressure of the inactive gas introduced in the inside of the processing apparatus F1 is optimized for the kind of the processing object S.

Further, while the material which configures the processing object S in the present embodiment is silicon, the processing object S which is a target of the present invention is not limited to this. Various materials such as metal and resin can be used as the processing object S in addition to silicon.

Further, while the "process" in the present embodiment includes a series of operations from melting by heating of silicon nuggets to formation of single crystal silicon (ingot) by drawing up from the molten material S1, the "process" in the present invention is wider in concept and signifies general operation for applying various physical variations or chemical variations to the processing object S in an airtight state.

—Processing Object Loading Apparatus—

As shown in FIG. 1, the processing object loading apparatus 1 can load the processing object S from the outside of the processing apparatus F1 into the furnace body F11 in the inside of the processing apparatus F1 described above. It is to be noted that, in the following description, associated elements which are to be separated at a joint section 15 hereinafter described and are placed on a processing object accommodation section 11 side with respect to the joint section 15 are generally referred to as loading apparatus main body 1a.

The processing object loading apparatus 1 includes the processing object accommodation section 11 and a feeding section 1b. The feeding section 1b is a section which feeds the processing object S accommodated in the processing object accommodation section 11 to the processing apparatus F1. The feeding section 1b includes a processing object path 12 and a processing object extraction mechanism 13. Further, the feeding section 1b includes the closing portion 14 and the joint section 15. Details of the components are hereinafter described.

The processing object S passes the processing object path 12 in the feeding section 1b from the processing object accommodation section 11 and is fed to the processing apparatus F1. A portion of the feeding path with which the processing object S contacts is configured from quartz glass which is a material having resistance against abrasion, or the inner face of the portion is configured from quartz glass. Consequently, the possibility that impurity such as metal powder produced by abrasion or the like may be mixed into the processing object S can be suppressed as far as possible, and single crystal silicon S2 having high purity can be fabricated.

In the present embodiment, the processing object accommodation section 11, part of the processing object path 12 and the processing object extraction mechanism 13 are provided in the inside of a supplying tank 111 made of stainless alloy. Where the processing object loading apparatus 1 is attached to the processing apparatus F1, the supplying tank 111 itself can maintain an airtight state against the outside air. It is to be noted that the "outside air" in the description of the present embodiment signifies an outside atmosphere of the processing object loading apparatus 1 and the processing apparatus F1.

The supplying tank 111 includes a supplying tank main body 111a having a substantially cylindrical shape and a projection 111b projecting in a horizontal direction from the supplying tank main body 111a. In the present embodiment, the supplying tank main body 111a and the projection 111b are integrated with each other by a flange connection as shown in FIG. 1. It is to be noted that such a structure may be adopted that the supplying tank ill is not provided and the processing object accommodation section 11 and the processing object path 12 are directly connected to each other such that an airtight state against the outside air can be maintained. Or, the supplying tank main body 111a and the projection 111b may be integrated with each other by welding or the like.

—Processing Object Accommodation Section (Hopper)—

The processing object accommodation section 11 is a section which can temporarily accommodate the processing object S until the processing object S is fed. And, the processing object accommodation section 11 includes an accommodation port 111c which can be opened and closed. The accommodation port 111c is used when a processing object S is accommodated into the processing object accommodation section 11. In the present embodiment, the accommodation port 111c can be opened and closed by a lid section 111d. Further, in the present embodiment, a hopper is used as the processing object accommodation section 11. The hopper 11 is provided by pasting flat plates of quartz glass in the supplying tank 111 described above. The hopper 11 is shaped such that an octagonal cone is connected to a lower end of an octagonal pillar whose upper and lower end portions are open. In the hopper 11, the lower end of the octagonal cone portion is open, and the processing object S gravity drops from the octagonal cone portion and is extracted to the feeding section 1b.

If the shape of the hopper 11 is adopted in which an octagonal pillar and an octagonal cone are combined with each other as in the present embodiment, then flat plates of quartz glass having a rectangular shape or a trapezoidal shape as viewed in plan can be combined to form the hopper 11. Therefore, the hopper 11 can be fabricated readily and the fabrication cost for the hopper 11 can be suppressed. It is to be noted that the shape of the processing object accommodation section 11 is not limited to such a shape that an octagonal pillar and an octagonal cone are combined with each other as in the hopper of the present embodiment, and a shape wherein a different multilateral pillar and a different multilateral cone are combined with each other may be adopted. Further, a cylindrical shape may be adopted for the processing object accommodation section 11 of the present invention as occasion demands.

The lid section 111*d* in the present embodiment is provided at an upper end portion of the supplying tank main body 111*a* such that an airtight state against the outside air can be maintained. By removing the lid section 111*d* from the supplying tank main body 111*a*, the accommodation port 111*c* can be opened so that the processing object S can be supplemented into the hopper 11.

—Processing Object Path—

The processing object path 12 is a portion through which the processing object S to be loaded into the processing apparatus F1 can pass. An upper end of the processing object path 12 is provided at a position at which the processing object S can be received from the hopper 11. Then, a downstream end (exit end) 12*a* of the processing object path 12 is provided at a position at which the processing object S can be loaded into the inside of the processing apparatus F1. More particularly, the downstream end 12*a* of the processing object path 12 is positioned in the inside of the processing apparatus F1 and above the furnace body F11.

The processing object path 12 in the present embodiment includes a first processing object path 121 positioned on the hopper 11 side and a second processing object path 122 positioned on the processing apparatus F1 side. The first processing object path 121 and the second processing object path 122 can be separated from and joined to each other at the joint section 15 hereinafter described. The downstream end 12*a* of the processing object path 12 belongs to the second processing object path 122 (more particularly to a second pipe 122*b*). In the present embodiment, the second processing object path 122 is not separated from the processing apparatus F1 except when the first pipe 122*a* and the second pipe 122*b* (hereinafter described) are replaced. Therefore, only it is necessary for a moving mechanism 2 (hereinafter described) to be capable of moving the first processing object path 121, but the moving mechanism 2 need not take a burden of movement of the second processing object path 122. In particular, since the processing object path 12 includes the first processing object path 121 and the second processing object path 122 in such a manner as described above, the design of the moving mechanism 2 can be simplified.

Then, the processing object path 12 and the hopper 11 are provided in a positional relationship in which the processing object S can be fed without being exposed to the outside air. In the present embodiment, the hopper 11 is formed in the inside of the supplying tank 111, and the first processing object path 121 is formed at a lower portion of the supplying tank 111. Therefore, the processing object S can be fed without being exposed to the outside air.

In the present embodiment, the first processing object path 121 is a portion which extends horizontally from just below the hopper 11 toward the front. Then, the first processing object path 121 exists across a lower portion of the supplying tank main body 111*a* and the projection 111*b* which projects forwardly from the lower portion of the supplying tank main body 111*a*. An expanded portion 122*a*1 (hereinafter described) of the first pipe 122*a* is positioned on the downstream side of the projection 111*b*, and the processing object S enters through the expanded portion 122*a*1 and is fed to the second processing object path 122.

The second processing object path 122 is connected to the downstream end of the first processing object path 121 through the joint section 15 such that the processing object S can pass therethrough. Further, the second processing object path 122 is disposed so as to be inclined obliquely forwardly downwards. It is to be noted that, in the present embodiment, as shown in FIG. 1, part of the second processing object path 122 (expanded portion 122*a*1 of the first pipe 122*a*) extends into the first processing object path 121. In this manner, the downstream end of the first processing object path 121 and the upstream end of the second processing object path 122 may be provided in an overlapping relationship with each other.

The second processing object path 122 in the present embodiment has a pipe unit (telescopic pipe unit) 122*x* formed from a combination of a first pipe 122*a* and a second pipe 122*b* disposed on the same axial line. In short, the telescopic pipe unit 122*x* configures part of the processing object path 12. Both of the first pipe 122*a* and the second pipe 122*b* are made of quarts glass. The outer diameter of the first pipe 122*a* (except an expanded portion 122*a*1) is formed smaller than the inner diameter of the second pipe 122*b* (except an expanded portion 122*b*1). Consequently, it is possible to insert the first pipe 122*a* (inserting side pipe) into the second pipe 122*b* (inserted side pipe). The telescopic pipe unit 122*x* can be extended and contracted in a longitudinal direction in response to the degree of the insertion, that is, the distance between the pipes 122*a* and 122*b* which are in a state in which they are not inserted (the total length of the telescopic pipe unit 122*x* can be varied). Upon such extension or contraction, a downstream end 122*b*2 of the second pipe 122*b* moves toward and away from the upstream end of the first pipe 122*a*.

An upstream side end portion of the first pipe 122*a* is a pipe entrance end which serves as an entrance of the processing object S and has an expanded portion 122*a*1 whose diametrical dimension increases toward a tip end thereof. As shown in FIG. 1, the expanded portion 122*a*1 is positioned below the downstream end of a trough 132 of the processing object extraction mechanism (electromagnetic vibration feeder) 13. This expanded portion 122*a*1 is a portion which introduces the processing object S fed on the trough 132 into the first pipe 122*a*. Meanwhile, a downstream end 122*a*2 of the first pipe 122*a* is cut by a sectional plane perpendicular to the longitudinal direction of the first pipe 122*a*. This downstream end 122*a*2 is a portion which is inserted into the second pipe 122*b* when the telescopic pipe unit 122*x* is contracted.

An upstream side end portion of the second pipe 122*b* has an expanded portion 122*b*1 whose diametrical dimension increases toward a tip end thereof. This expanded portion 122*b*1 is a portion for attaching the second pipe 122*b* to a second pipe supporting portion 16 connected to a driving plate 175 (hereinafter described) of the path moving mechanism 17. Further, the expanded portion 122*b*1 can serve also as a guide for guiding the downstream end 122*a*2 of the first pipe 122*a* when the first pipe 122*a* is to be inserted into the second pipe 122*b*. Further, a closing section 14 (hereinafter described) is provided above the expanded portion 122*b*1. This closing section 14 is integrated with the second pipe 122*b*. Meanwhile, the downstream end 122*b*2 of the second pipe 122*b* (coincident with the downstream end 12*a* of the processing object path 12) is a pipe exit end which serves as an exit for the processing object S and coincides with the downstream end 12*a* of the processing object path 12. This downstream end 122*b*2 may be cut in a horizontal direction as shown in the figure. Or, the downstream end 122*b*2 may be cut in a vertical direction (direction perpendicular to a vertical line C which passes the center of the furnace body F11).

Figure 2:
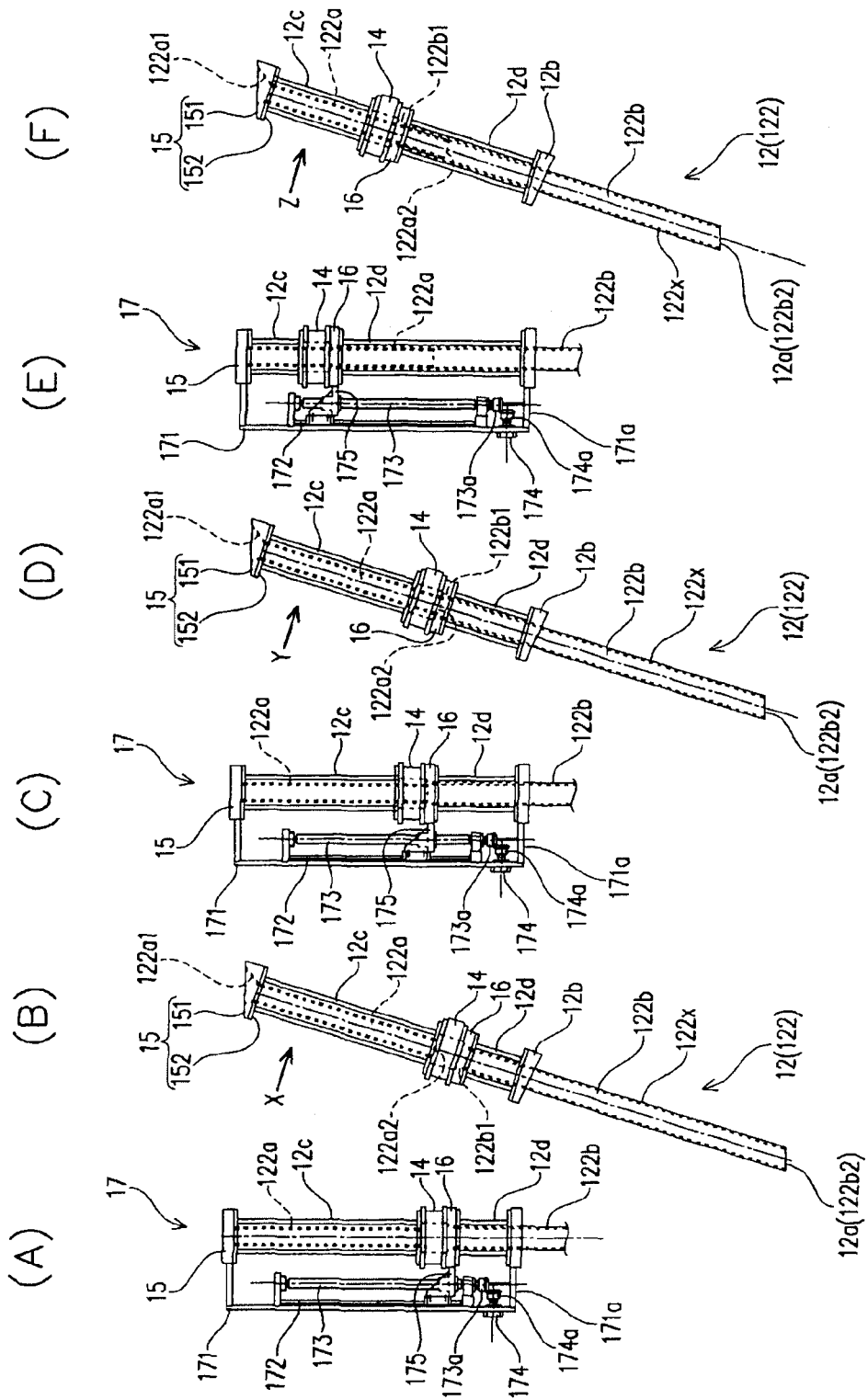
FIG. 2 shows a second processing object path and a joint section, and (A) and (B) of FIG. 2 illustrate a state in which a telescopic pipe unit is extended most and wherein (B) of FIG. 2 is a schematic view as viewed in side elevation and (A) of FIG. 2 is a schematic view as viewed in a direction indicated by an arrow mark X of (B) of FIG. 2, (C) and (D) of FIG. 2 illustrate a state of an intermediate length of the telescopic pipe unit and wherein (D) of FIG. 2 is a schematic view as viewed in side elevation and (C) of FIG. 2 is a schematic view as viewed in a direction indicated by an arrow mark Y of (D) of FIG. 2, and (E) and (F) of FIG. 2 illustrate a state in which the telescopic pipe unit is contracted most and wherein (F) of FIG. 2 is a schematic view as viewed in side elevation and (E) of FIG. 2 is a schematic view as viewed in a direction indicated by an arrow mark Z of (F) of FIG. 2.

Since the second processing object path 122 is configured in such a manner as described above, it is possible to move the second pipe 122*b* with respect to the first pipe 122*a* while the joining position of the joint section 15 (upper end portion in the figure) with the first processing object path 121 is maintained (while the position of the pipe entrance end is fixed) as shown in (B), (D) and (F) of FIG. 2 to extend or contract the second processing object path 122 in the longitudinal direction. Since the second processing object path 122 can be extended or contracted by insertion or by approaching or receding movement of the telescopic pipe unit 122x in this manner, the downstream end 12a of the second processing object path 122 can be moved toward and away from the furnace body F11 by the comparatively simple configuration.

(B) of FIG. 2 illustrate a state in which the telescopic pipe unit 122x is extended most. (D) of FIG. 2 illustrates another state in which the telescopic pipe unit 122x is contracted a little. (F) of FIG. 2 illustrates a further state in which the telescopic pipe unit 122x is contracted further. In the state illustrated in (B) of FIG. 2, the first pipe 122a is not yet inserted in the second pipe 122b. It is to be noted that, in this state, since the first pipe 122a does not exist in the closing section 14, the closing section 14 can be closed. In the state illustrated in (D) of FIG. 2, the closing section 14 is open, and the first pipe 122a is inserted in the second pipe 122b. Therefore, the first pipe 122a exists in the closing section 14.

In this manner, it is possible for the second processing object path 122 to have an arbitrary length within a range within which the telescopic pipe unit 122x can be extended and contracted. In the present embodiment, the first pipe 122a is fixed to the processing apparatus F1 by a fixing portion 12b. Thus, the first pipe 122a is not moved with respect to the processing apparatus F1, but the second pipe 122b is moved. Therefore, the position of the downstream end 12a of the second processing object path 122 with respect to the processing apparatus F1 (more particularly to the furnace body F11) can be varied readily.

Further, in the present embodiment, in order to protect the pipes 122a and 122b made of quartz glass from damage, a portion of each of the pipes 122a and 122b which can contact with the outside air between the processing apparatus F1 and the joint section 15 has air-tightness and besides is covered with protective bellows 12c and 12d as facings which can be extended and contracted in the longitudinal direction. The protective bellows 12c and 12d are formed as bellows, for example, by welding or integration forming of thin plates of stainless alloy and are extended or contracted in response to extension or contraction of the telescopic pipe unit 122x.

In the present embodiment, the first protective bellows 12c exists between the lower side joint member 152 of the joint section 15 and the closing section 14 and is connected airtight between the lower side joint member 152 and the closing section 14. Meanwhile, the second protective bellows 12d exists between the closing section 14 and the fixing portion 12b and is connected airtight to the closing section 14 and the fixing portion 12b.

It is to be noted that the configuration of the second processing object path 122 is not limited to that of the present embodiment but allows various modifications. For example, a member in the form of a bellows may be used to extend or contract the second processing object path 122. Further, while the pipes 122a and 122b in the present embodiment have a form of a straight pipe having a fixed diametrical dimension except the expanded portions 122a1 and 122b1, the diametrical dimension may vary like that of a tapered pipe. Or, as occasion demands, the pipes 122a and 122b may have a form of a curved pipe which is curved with a predetermined curvature. Further, the telescopic pipe unit 122x may be configured by a combination of three or more pipes.

—Processing Object Extraction Mechanism—

The processing object extraction mechanism 13 is a portion for feeding a processing object S from the processing object accommodation section 11 described above to the processing object path 12 in an airtight state. In the present embodiment, an electromagnetic vibration feeder is used as the processing object extraction mechanism 13. The electromagnetic vibration feeder is provided in the inside of the first processing object path 121. In particular, the processing object extraction mechanism 13 is provided on the feeding section 1b. Therefore, the processing object extraction mechanism 13 is not limited to a mechanism provided in the inside of the processing object path 12 as in the present embodiment, but the processing object extraction mechanism 13 may be provided at a position spaced from the processing object path 12.

The electromagnetic vibration feeder described above includes a driving section 131 and a trough 132. By vibrating the trough 132 by means of the driving section 131, processing object articles S placed on the trough 132 can be fed to the downstream side. The trough 132 is a chute-shaped portion whose upper portion and downstream end are open, and quartz glass is pasted to an inner face of the trough 132 in the present embodiment. The trough 132 is provided so as to extend from just below the hopper 11 to the proximity of the downstream end of the first processing object path 121 along an extending direction of the first processing object path 121. Consequently, the processing object articles S gravity-dropping from the lower end of the hopper 11 are fed to the downstream side while being received on the trough 132. Then, the processing object articles S coming to the downstream end of the trough 132 drop to the expanded portion 122a1 of the first pipe 122a described above.

In the present embodiment, since an electromagnetic vibration feeder is used as the processing object extraction mechanism 13, the processing object articles S can be successively loaded quantitatively into the processing apparatus F1. Therefore, the processing object articles S can be successively loaded little by little into the furnace body F11, and consequently, enhancement of the efficiency and the accuracy of the processing can be achieved. Naturally, also a small amount of the processing object S can be loaded. Further, although there is the possibility that breaking of the furnace body by splash of molten material or a shock upon loading or the like may occur if the processing object articles are loaded at once, since an electromagnetic vibration feeder is used as described above, such possibility as described above can be eliminated. Further, since a small amount of the processing object S can be loaded, also where the processing object S is loaded into the furnace body F11 during operation of the processing apparatus F1, sudden temperature dropping of the molten material S1 can be suppressed, and this is advantageous in quality management.

In the present embodiment, the first processing object path 121 extends in a horizontal direction and the second processing object path 122 is inclined obliquely forwardly downwards. Therefore, in the first processing object path 121, the processing object S is fed in a horizontal direction by the electromagnetic vibration feeder, but, in the second processing object path 122, the processing object S is fed obliquely downwardly by gravity drop. However, the present invention is not limited to this mode, and, for example, both of the first processing object path 121 and the second processing object path 122 may be configured so as to be directed obliquely downwardly or downwardly and feed the processing object S by gravity drop. In this instance, for example, a flow rate adjustment mechanism such as a gate or a valve provided at a lower portion of the hopper 11 functions as the processing object extraction mechanism 13.

Also where the processing object extraction mechanism 13 is used to feed the processing object S in a horizontal direction, not only such an electromagnetic vibration feeder as in the present embodiment but also various feeding mechanisms having a function capable of feeding the processing object S from the one side to the other side such as a belt conveyer or a roller conveyer can be used. Naturally, the feeding direction of the processing object S by the processing object extraction mechanism 13 may be set to a direction other than the horizontal direction.

—Closing Section—

The closing section 14 is a section which can separate the processing apparatus F1 side of the feeding section 1b and the processing object accommodation section 11 side from each other. In the present embodiment, the closing section 14 is provided such that it can separate the first pipe 122a and the second pipe 122b from each other of the telescopic pipe unit 122x. This closing section 14 includes an opening/closing member (valve body) (not shown) which can close the space in the closing section 14 for the separation described above. The closing section 14 is a gate valve provided at one place at an upper end of the second pipe 122b of the second processing object path 122 as shown in FIG. 2. The closing section 14 and the second pipe 122b are connected to each other in an airtight state. By closing the closing section 14, the portion on the processing apparatus F1 side with respect to the closing section 14 can be closed up in an airtight state. Then, by the closing section 14, the feeding section 1b can be closed up so that the processing object S may not leak out. As a type of the valve to be used for the closing section 14, in addition to a gate valve, various valves can be used such as, for example, a globe valve, a ball valve or a butterfly valve if conditions permit.

Here, the downstream end 122a2 of the first pipe 122a of the second processing object path 122 is positioned on the downstream side with respect to the opening/closing member described hereinabove when the closing section 14 is opened as seen in (D) and (F) of FIG. 2. In short, in this instance, loading of the processing object S is carried out in a state in which the downstream end 122a2 of the first pipe 122a is inserted in the second pipe 122b. Consequently, the opening/closing member and a component (O-ring, packing or the like) which closely contacts with the opening/closing member to implement the separation described above can be prevented from being contacted by a processing object S which passes the second processing object path 122. Therefore, occurrence of failure in separation of the closing section 14 by jamming caused by a fragment of a processing object S can be prevented.

While, in the present embodiment, the closing section 14 is provided at an upper end of the second pipe 122b, the provided position of the closing section 14 is not limited to this. The closing section 14 may be provided at a different position in the feeding section 1b. However, where the processing object path 12 is separated by the joint section 15, in order to maintain an airtight state of the processing apparatus F1 after the separation, it is necessary for the closing section 14 to be provided on the side of the processing apparatus F1 with respect to the joint section 15. It is to be noted that, in order to maintain the airtight state of both of the processing apparatus F1 and the loading apparatus main body 1a, the closing section 14 may be provided on both of the side of the processing apparatus F1 and the side of the loading apparatus main body 1a across the joint section 15.

By providing the closing section 14 in this manner, if the closing section 14 is closed, then the hopper 11 can be opened to the outside air while an inactive gas atmosphere in the inside of the processing apparatus F1 is maintained. Therefore, the lid section 111d can be opened to supplement processing object articles S into the hopper 11 while melting of the processing object articles S in the furnace body F11 of the processing apparatus F1 is continued. Then, by opening the closing section 14 after the supplementation of the processing object articles S into the hopper 11, the processing object articles S newly supplemented in the hopper 11 can be introduced into the furnace body F11. It is to be noted that, where the processing object articles S newly supplemented in the hopper 11 can be loaded into the furnace body F11, it is necessary to place the hopper 11 side in an inactive gas atmosphere with respect to the closing section 14.

Conventionally, if processing object articles accommodated in a hopper are used up, then it is necessary to cool the furnace body once, cancel the inactive gas atmosphere, supplement processing object articles into the hopper, make an inactive gas atmosphere again and re-heat the furnace body. Therefore, time loss, more particularly, idle time (operation stopping time), is much, and this is not desirable in quality management. On the other hand, in the present embodiment, by providing the closing section 14, processing object articles S can be supplemented into the processing object loading apparatus F1 without destroying the special atmosphere in the inside of the processing apparatus F1, and as a result, idle time can be reduced and the productivity can be enhanced. Therefore, the problem of the conventional technique described above can be solved.

—Joint Section—

In addition to the closing section 14 described above, the joint section 15 capable of separating and joining the carrying section 1b is provided at a position in the processing object path 12 on the processing object accommodation section 11 side with respect to the closing section 14. By the joint section 15, the carrying section 1b can be separated. The joint section 15 may be provided at any position of the carrying section 1b if the position is a position on the processing object accommodation section 11 side with respect to the closing section 14. As shown in (A) of FIG. 2, by the joint section 15, a portion (loading apparatus main body 1a in the present embodiment) of the processing object loading apparatus 1 on the hopper 11 side with respect to the joint section 15 can be separated from the processing apparatus F1. Therefore, in the present embodiment, supplying of the processing object S to a plurality of such processing apparatus F1 can be carried out by the single loading apparatus main body 1a. In short, a number of loading apparatus main bodies 1a equal to that of the processing apparatus F1 are not necessarily provided. It is to be noted that the quantities of such processing apparatus F1 and loading apparatus main bodies 1a may be set in a one by one corresponding relationship to each other.

In the present embodiment, as shown in FIG. 1, the joint section 15 is provided between the first processing object path 121 and the second processing object path 122. More particularly, an upper side joint member 151 is provided at a downstream end of the first processing object path 121, and a lower side joint member 152 is provided at an upstream end of the second processing object path 122 (except the enlarged portion 122b1 of the second pipe 122b). In the present embodiment, the joint members 151 and 152 substantially have a form of a flange and can be joined together in an airtight state by closely contacting abutting faces thereof, which have an opposing relationship to each other, with each other.

Since the closing section 14 and the joint section 15 are provided in such a manner as described above, when the first processing object path 121 and the second processing object path 122 of the processing object path 12 are divided at the joint section 15, an airtight state of the downstream side portion of the processing object path 12 with reference to the moving direction of the processing object S can be maintained by the closing section 14. In particular, the following can be achieved. In particular, if processing object articles S remain in the inside of the hopper 11 at a point of time at which it becomes unnecessary to supplement processing object articles S into the processing apparatus F1, then it is possible to separate, after the closing section 14 is closed, the processing object path 12 at the joint section 15 and apply the loading apparatus main body 1a to a processing apparatus F1 different from that before the separation. Consequently, the processing object articles S remaining in the hopper 11 can be loaded into the different processing apparatus F1.

If the processing object articles S accommodated in the hopper 11 are used up, then the telescopic pipe unit 122x is extended into a state in which the first pipe 122a does not exist in the closing section 14 and then the closing section 14 is closed, whereafter the processing object path 12 is separated at the joint section 15 as shown, for example, in (A) and (B) of FIG. 2. Then, the loading apparatus main body 1a is moved down by a manipulation of a lift 21 to move the loading apparatus main body 1a to a favorable position, and then processing object articles S are supplemented into the hopper 11. Thereafter, the loading apparatus main body 1a is attached to a processing apparatus F1 different from that before the separation. However, the loading apparatus main body 1a may be attached again to the processing apparatus F1 same as that before the separation. Particularly if the loading apparatus main body 1a is supported by the lift 21 described below, the supplementing operation described above can be carried out efficiently.

Further, although there is a demerit that it is necessary to frequently carry out supplementing of processing object articles S into the hopper 11, by decreasing the capacity of the hopper 11, it is possible to make the loading apparatus main body 1a compact and further facilitate handling. Although this cannot be applied in any fabrication site, according to the present embodiment, such selection is made possible, and optimization of an apparatus suitable for a situation of the fabrication site can be anticipated.

Here, in a case in which the closing section 14 is provided only at one place in the processing object path 12, since an inactive gas atmosphere in the inside of the loading apparatus main body 1a is lost by the separation of the joint section 15, it is necessary to adjust the inside of the loading apparatus main body 1a to an inactive gas atmosphere again. Therefore, it seems a possible idea to provide a different closing section in the processing object path 12 across the joint section 15. If the countermeasure just described is adopted, then since an interval within which an inactive gas atmosphere is to be adjusted can be made a comparatively short interval between the closing section 14 and the different closing section, the operation efficiency can be improved very much advantageously.

Further, in the present embodiment, also upon separation of the joint section 15, the second processing object path 122 is left in the processing apparatus F1. Therefore, a separation operation of the second processing object path 122 from the processing apparatus F1 becomes unnecessary, and movement of the loading apparatus main body 1a by the moving mechanism 2 is facilitated. Also the possibility that the pipes 122a and 122b of the second processing object path 122 may be broken upon movement of the loading apparatus main body 1a can be reduced.

Further, where the joint section 15 is provided, the second processing object path 122 can be separated from the first processing object path 121 and moved. Therefore, movement of the downstream end 12a of the processing object path 12 between a position in a central region hereinafter described (region including the vertical line C which passes the center of the furnace body F11 and having an extent) and a position displaced from the central region can be carried out by movement only of the second processing object path 122. Therefore, the space necessary for the movement can be made small and the processing object loading apparatus 1 can be miniaturized. Further, since the movement of the downstream end 12a of the processing object path 12 by the path moving mechanism 17 can be carried out separately from the movement by the moving mechanism 2 (in other words, there is no necessity for the moving mechanism 2 to take charge of movement of the downstream end 12a of the processing object path 12), the configuration of the moving mechanism 2 can be simplified. From this point, increase in size of the processing object loading apparatus 1 can be suppressed.

Here, a procedure of supplementing processing object articles S using the processing object loading apparatus 1 according to the present embodiment is described briefly. If the amount of remaining processing object articles S in the furnace body 11F becomes small during processing of processing object articles S by the processing apparatus F1, then processing object articles S accommodated in the hopper 11 are fed along the processing object path 12 of the feeding section 1b by an operation of the electromagnetic vibration feeder which configures the processing object extraction mechanism 13 and are loaded into the furnace body F11. In this state, the closing section 14 is open and the joint section 15 is joined.

If the processing object articles S in the processing object accommodation section 11 are consumed, then the operator would first close up the closing section 14 and then separate the joint section 15. Consequently, the joint section 15 can be separated while the inactive gas atmosphere in the inside of the processing apparatus F1 is maintained. Then, the operator would use the moving mechanism 2 to move the loading apparatus main body 1a to a favorable position as shown in (B) of FIG. 2, open the accommodation port 111c and supplement processing object articles S into the hopper 11. Prior to the opening of the accommodation port 111c, the operator would introduce the outside air into the loading apparatus main body 1a to cancel the inert gas atmosphere.

The operator would, after processing object articles S are supplemented as described above, joins the joint section 15 using the moving mechanism 2. Thereafter, the operator would open the closing section 14 to establish a state in which processing object articles S can be loaded into the furnace body F11. It is to be noted that, when processing object articles S are to be loaded into the furnace body F11, the operator would place the internal space of the processing apparatus F1 into a vacuum state and then introduce inactive gas to establish an inactive gas atmosphere in the inside of the loading apparatus main body 1a.

—Moving Mechanism—

Further, in the present embodiment, the moving mechanism 2 which can move the loading apparatus main body 1a in directions toward and away from the processing apparatus F1 is provided as shown in FIG. 1. The moving mechanism 2 in the present embodiment includes a lift 21 and a plurality of wheels 22 (front wheels 221 and rear wheels 222). The lift 21 can move the loading apparatus main body 1a in the upward and downward directions. In the present embodiment, while a manual lift of the type which moves the loading apparatus main body 1a upwardly and downwardly by a handle manipulation by an operator, alternatively a lift of the type which is driven by a motor or the like may be adopted. The wheels 22 can rotate along an installation face G on which the processing apparatus F1 is installed to move the loading apparatus main body 1a and the lift 21 principally in the forward and backward directions and can further move the loading apparatus main body 1*a* and the lift 21 also in the leftward and rightward directions.

By the moving mechanism 2, it is facilitated to move the loading apparatus main body 1*a* to separate and join the joint section 15. Further, the loading apparatus main body 1*a* can be moved to a different processing apparatus F1. Further, by moving down the processing apparatus F1 to the proximity of the installation face G, supplementation of the processing object S can be simplified. Or, if the processing apparatus F1 is placed at a high position as shown in FIG. 1, then feeding of the processing object S in a portion (in the present embodiment, in the second processing object path 122) along which gravity drop occurs can be made smoother. In this manner, by the provision of the moving mechanism 2, the processing object loading apparatus 1 is very good in convenience in use. Further, also restrictions to the layout at the fabrication site can be reduced.

—Movement of the Processing Object Path—

In the present embodiment, the position of the downstream end 12*a* of the processing object path 12 with respect to the processing apparatus F1 can be moved. This movement of the downstream end 12*a* can be carried out between a position in the central region which is a region having an extent including the vertical line C which passes the center of the furnace body F11 and another position displaced from the central region. The "central region" signifies a region in which drawing up of single crystal silicon S2 is possible except a circumferential edge portion of the furnace body F11. In the present embodiment, more particularly the movement of the downstream end 12*a* is carried out in directions in which the downstream end 12*a* approaches and recedes from the reference provided by the vertical line C which passes the center of the furnace body F11, and the second pipe 122*b* of the second processing object path 122 moves with respect to the processing apparatus F1 (more particularly with respect to the furnace body F11). It is to be noted that this movement of the second pipe 122*b* is carried out separately from the movement of the first processing object path 121.

The approaching and receding regarding the movement of the downstream end 12*a* are carried out such that, when a forwardmost portion of the downstream end 12*a* of the processing object path 12 approaches the vertical line C (when the forwardmost portion of the downstream end 12*a* is positioned in the central region described hereinabove), the forwardmost portion of the downstream end 12*a* is positioned in the inner side with respect to an upward movement locus S2*a* of the single crystal silicon S2. Then, when the downstream end 12*a* recedes (when the forwardmost portion of the downstream end 12*a* is positioned displaced from the central region described hereinabove), the approaching and receding are carried out such that the forwardmost portion of the downstream end 12*a* is positioned on the outer side with respect to the movement locus S2*a*.

Therefore, when the downstream end 12*a* approaches the vertical line C (when the forwardmost portion of the downstream end 12*a* is positioned in the central region described hereinabove), it is possible to load processing object articles S from the processing object path 12 substantially to the center of the furnace body 11F. In other words, in comparison with an alternative case wherein processing object articles S are loaded on the outer side with respect to the movement locus S2*a*, the processing object articles S can be loaded from the processing object path 12 at a position nearer to the center of the furnace body F11. Since processing object articles S can be loaded from the processing object path 12 to a position nearer to the center of the furnace body F11 in this manner, the processing object articles S are less likely to be one-sided in the furnace body, and the silicon granulation loaded in the furnace body is heated uniformly and can be melted efficiently. Therefore, also drawing up operation of single crystal silicon can be carried out smoothly, and the fabrication efficiency is high. Further, since such a situation that processing object articles S before melting overflow from the furnace body F11 does not occur, processing object articles S can be loaded by a fixed quantity and the working efficiency is high.

Then, when the downstream end 12*a* recedes from the vertical line C (when the forwardmost portion of the downstream end 12*a* is positioned in a spaced relationship from the central region described hereinabove), single crystal silicon S2 can be drawn up from the furnace body F11 without interfering with the processing object path 12.

It is to be noted that, where the downstream end 122*b*2 of the second pipe 122*b* is cut open along a plane parallel to the vertical line C which passes the center of the furnace body F11, if the downstream end 12*a* overlaps with the vertical line C when the downstream end 12*a* approaches the vertical line C (when the downstream end 12*a* is positioned in the central region described hereinabove, then if the second pipe 122*b* is moved at least by a distance equal to the radius of the movement locus S2*a* of the single crystal silicon S2, then interference between the single crystal silicon S2 drawn up from the furnace body F11 and the second pipe 122*b* can be avoided. In other words, the distance of the movement of the second pipe 122*b* can be minimized.

In order to allow movement over at least part of the processing object path 12, the processing object loading apparatus 1 includes the path moving mechanism 17. In the present embodiment, the second pipe 122*b* is moved in the longitudinal direction by the path moving mechanism 17, and the second processing object path 122 comes into and out of the processing apparatus F1 upon such movement. As described hereinabove, it is possible to insert the first pipe 122*a* into the second pipe 122*b*, and the telescopic pipe unit 122*x* can be extended and contracted in response to the degree of insertion of the first pipe 122*a* or to the distance between the pipes 122*a* and 122*b* which are in a non-insertion state with each other. Therefore, while the joining position at the joint section 15 is maintained, it is possible to move the second pipe 122*b* into and out of the processing apparatus F1 to extend and contract the second processing object path 122 in the longitudinal direction.

Here, if the downstream end 12*a* of the processing object path 12 is disposed at a position as near as possible to the surface of molten material S1 or to unmelted processing object articles S in the furnace body F11, then unmelted processing object articles S loaded already are piled up like a mountain in the furnace body F11 before the downstream end 12*a* of the second processing object path 122 is closed up, then the processing object articles S are sometime choked in the second processing object path 122. Also in this instance, by retracting the second processing object path 122 with respect to the processing apparatus F1, a clearance can be provided between the processing object articles S piled up like a mountain as described above and the downstream end 12*a* of the second processing object path 122 while the state in which processing object articles S can be loaded from the processing object accommodation section 11 is maintained. Consequently, also in the case described above, processing object articles S can be loaded into the furnace body F11. Further, as melting of the processing object articles S proceeds, the surface of the molten material in the furnace body F11 rises and the downstream end 12*a* of the second processing object path 122 is sometimes soaked into the molten material. Also in this instance, by retracting the second processing object path 122 with respect to the processing apparatus F1, the downstream end 12a of the second processing object path 122 can be spaced away from the rising surface of the molten material.

—Path Moving Mechanism—

In the following, the path moving mechanism 17 in the present embodiment is described in more detail. As shown in (A), (C) and (E) of FIG. 2, the path moving mechanism 17 includes a frame 171, a support shaft 172, a drive shaft 173, a driven section 174, and a driving plate 175.

The frame 171 is a part fixed directly or indirectly to the processing apparatus F1 and is immovable with respect to the processing apparatus F1. In the present embodiment, a fixing plate 171a is fixed to the processing apparatus F1 at a position on the downstream side of the frame 171.

The support shaft 172 is fixed to the frame 171. The support shaft 172 is a round bar provided in parallel to the longitudinal direction of the second pipe 122b. Further, the drive shaft 173 is provided at a position of a portion of the frame 171, which extends in parallel to the support shaft 172, on the opposite side across the second pipe 122b. Further, on the side of the frame 171 nearer to the drive shaft 173, the driven section 174 is provided for rotation. The axis of rotation of the driven section 174 extends perpendicularly to the drive shaft 173. The drive shaft 173 is a round bar having threads on an outer circumferential face thereof and can rotate in a circumferential direction with respect to the frame 171. A bevel gear 173a is attached to a downstream side end portion of the drive shaft 173 is attached. The bevel gear 173a is held in meshing engagement with another bevel gear 174a provided similarly at an end portion of the driven section 174. Therefore, the drive shaft 173 can be rotated by rotation of the driven section 174. It is to be noted that the driven section 174 may be automatically operated by driving means such as a motor connected thereto or may be manually operated by a handle or the like attached thereto.

The driving plate 175 is connected to the second pipe supporting portion 16 and supports the second pipe 122b against movement. Further, the support shaft 172 and the drive shaft 173 are attached to the driving plate 175 such that they extend through the driving plate 175. Such extension through the driving plate 175 is carried out such that the driving plate 175 is attached for sliding movement to the support shaft 172 and attached for threaded engagement to the drive shaft 173. Consequently, it is possible to move the driving plate 175 toward and away from the fixing plate 171a in response to rotation of the drive shaft 173 by operation of the driven section 174. Then, when the driving plate 175 makes a movement to approach the fixing plate 171a, the second pipe 122b approaches the vertical line C which passes the center of the furnace body F11 and the forwardmost portion of the downstream end 12a moves to a position in the central region described hereinabove. When the driving plate 175 make a movement to recede from the fixing plate 171a, the second pipe 122b moves away from the vertical line C, and the forwardmost portion of the downstream end 12a moves to a position outside the central region described above. It is to be noted that, since the first pipe 122a and the second pipe 122b are extended and contracted in combination, the position of the joint section 15 does not vary but is maintained.

The position of the second pipe 122b with respect to the processing apparatus F1 can be set freely within a range within which the driving plate 175 moves. Therefore, the loading position of the processing object S into the furnace body F11 can be set freely. Besides, since the position of the joint section 15 does not vary but is maintained as described above, the second pipe 122b can be moved with the loading apparatus main body 1a kept connected thereto.

—Other Modifications—

The particular configuration of the present invention is not limited to the embodiment and the modification described above, but can be modified in various forms without departing from the subject matter of the present invention.

For example, at least one of the joint members 151 and 152 of the joint section 15 may include a guiding section while the other one of the joint members 151 and 152 includes a guided section. The guiding section and the guided section are configured such that, when it is tried to join the joint members 151 and 152 to each other, the guided section is guided by the guiding section to establish a joined state, and are portions by which positioning of the joint section 15 to a joined state is carried out. By the configuration, since the guided section is guided by the guiding section until the joint section 15 is positioned to a predetermined position, the joint work can be carried out readily.

Further, the processing object loading apparatus 1 may include a stopper as a positioning section for restricting movement of the moving mechanism 2 in any other direction than the upward and downward directions. In particular, it is a possible idea to provide a stopper for stopping rotation of at least the front wheels 221 from among the plural wheels 22 and defining the position of the front wheels 221 in the leftward and rightward direction with respect to the processing apparatus F1 such that it is immovable with respect to the installation face G. By providing the stopper in this manner, joining of the joint section 15 can be carried out readily.

DESCRIPTION OF REFERENCE SYMBOLS

1 Processing object loading apparatus
1b Feeding section
11 Processing object accommodation section, hopper
111c Accommodation port
12 Processing object path
12a Exit end, downstream end of processing object path
122a First pipe
122b Second pipe
122x (Telescopic) pipe unit
12c, 12d Facing, protective bellows
13 Processing object extraction mechanism, electromagnetic vibration feeder
14 Closing section, gate valve
15 Joint section
F1 Processing apparatus
F11 Processing section, furnace body (pot)
S Processing object, silicon nugget

What is claimed is:

1. A loading apparatus for loading raw material into a processing apparatus that processes the raw material in an airtight state, the loading apparatus comprising:
   an accommodation section that accommodates the raw material;
   a feeding path through which the raw material is fed, in an airtight state, into the processing apparatus, the feeding path having a first path and a second path located downstream of the first path;
   a feeding mechanism that feeds, in an airtight state, the raw material from the accommodation section to the first path;
   a joint section that separates and joins the first path and the second path; and a closing section, positioned in the second path, configured to be opened and closed to maintain the processing apparatus and a portion of the second path located downstream of the closing section in an airtight state, when the joint section separates the first path and the second path, wherein the second path is extendable and contractible in length to move a downstream end thereof with respect to the joint section while the first path and second path remain joined.

2. The loading apparatus according to claim 1, wherein the second path is a telescopic pipe unit having an upstream pipe and a downstream pipe disposed along an axial line, the downstream pipe having the downstream end, the downstream end being arranged inside the processing apparatus through which the raw material is fed into the processing apparatus, and the downstream pipe being movable in a longitudinal direction with respect to the upstream pipe to extend and contract the length of the telescopic pipe unit.

3. The loading apparatus according to claim 2, wherein one of the upstream pipe and the downstream pipe is configured to be inserted into the other of the upstream pipe and the downstream pipe to form the telescopic pipe unit, the closing section being disposed between a downstream end of the upstream pipe and an upstream end of the downstream pipe, and the raw material being fed through the telescopic pipe unit when the closing section is open and the one of the upstream pipe and the downstream pipe is inserted into the other of the upstream pipe and the downstream pipe.

4. The loading apparatus according to claim 2, wherein a portion of the telescopic pipe unit exposable to outside air, is airtight and is covered with a flexible cover in the longitudinal direction.

5. The loading apparatus according to claim 2, wherein the accommodation section has an accommodation port which can be opened and closed and through which the raw material is supplied into the accommodation section.

6. The loading apparatus according to claim 2, further comprising:

a furnace body, provided in the processing apparatus, that melts the raw material in an airtight state.

7. The loading apparatus according to claim 2, further comprising:

a moving mechanism that moves the accommodation section, the first path, and the feeding mechanism towards and away from the processing apparatus.

8. A pipe unit for use with a loading apparatus for loading raw material accommodated in an accommodation section into a processing apparatus that processes the raw material in an airtight state, the pipe unit comprising:

an entrance end, located outside the processing apparatus, to which the raw material is supplied from the accommodation section;

an exit end, located inside the processing apparatus, from which the raw material is fed into the processing apparatus;

a joint section that separates and joins the entrance end and a path to the accommodation section; and a closing section, provided between the entrance end and the exit end, configured to be opened and closed to maintain the processing apparatus and a first portion of the pipe unit between the exit end and the closing section in an airtight state, when the joint section separates the entrance end from the path to the accommodation section, wherein the pipe unit is extendable and contractible in length while a position of the entrance end is fixed.

9. The pipe unit according to claim 8, further comprising:

a first pipe having the entrance end; and a second pipe having the exit end, the second pipe being disposed downstream of the first pipe and on the same axial line as the first pipe, wherein the second pipe is movable in a longitudinal direction with respect to the first pipe to extend and contract the length of the pipe unit.

10. The pipe unit according to claim 9, wherein one of the first pipe and the second pipe is inserted into the other of the first pipe and the second pipe when the length of the pipe unit contracts, the closing section being disposed between the first pipe and the second pipe, and the raw material being fed through the pipe unit when the closing section is open and the one of the first pipe and the second pipe is inserted into the other of the first pipe and the second pipe.

11. The pipe unit according to claim 9, wherein a second portion of the pipe unit exposable to outside air, is airtight and is covered with a flexible cover in the longitudinal direction.

\* \* \* \* \*